United States Patent
Raguin et al.

(10) Patent No.: US 7,453,611 B2
(45) Date of Patent: Nov. 18, 2008

(54) REPLICATION OF DATA TO HOLOGRAPHIC MEDIUM USING HOLOGRAPHIC MASTER MEDIA

(75) Inventors: Daniel H. Raguin, Acton, MA (US);
David A. Waldman, Concord, MA (US);
George Barbastathis, Boston, MA (US)

(73) Assignee: STX Aprilis, Inc., Maynard, MA (US)

( * ) Notice: Subject to any disclaimer, the term of this patent is extended or adjusted under 35 U.S.C. 154(b) by 0 days.

(21) Appl. No.: 11/450,158

(22) Filed: Jun. 9, 2006

(65) Prior Publication Data

US 2007/0053029 A1    Mar. 8, 2007

Related U.S. Application Data

(63) Continuation of application No. PCT/US2004/044017, filed on Dec. 30, 2004.

(60) Provisional application No. 60/533,296, filed on Dec. 30, 2003.

(51) Int. Cl.
*G03H 1/20* (2006.01)
(52) U.S. Cl. ..................................... 359/12
(58) Field of Classification Search .................. 359/1, 359/10, 15, 22, 24, 25, 32, 12
See application file for complete search history.

(56) References Cited

U.S. PATENT DOCUMENTS

| | | | | |
|---|---|---|---|---|
| 3,600,056 A * | 8/1971 | King, Jr. | ........................ | 359/12 |
| 4,750,153 A | 6/1988 | Owechko et al. | | |
| 5,850,299 A * | 12/1998 | Lande et al. | .................... | 359/1 |
| 6,445,470 B1 | 9/2002 | Jenkins et al. | | |
| 6,721,076 B2 * | 4/2004 | King et al. | ..................... | 359/35 |
| 2001/0028485 A1 * | 10/2001 | Kremen | ........................ | 359/31 |
| 2005/0259299 A1 * | 11/2005 | El Hafidi et al. | .............. | 359/10 |

FOREIGN PATENT DOCUMENTS

WO     WO 97/01133 A     1/1997

OTHER PUBLICATIONS

Piazzolla, S., et al., "Single-Step Copying Process for Multiplexed Volume Holograms," *Optical Letters*, Optical Society of America, Washington, U.S., vol. 17, No. 9, 676-678, May 1, 1992.
Arnab, S., and Barbastathis, G., "Resonant Holography," *Optical Letters*, Optical Society of America, Washington, U.S., vol. 17, No. 6, 385-387, Mar. 6, 2002.

* cited by examiner

*Primary Examiner*—Alessandro Amari
(74) *Attorney, Agent, or Firm*—Hamilton, Brook, Smith & Reynolds, P.C.

(57) ABSTRACT

An apparatus for replicating holographically recorded data, comprising a holographic master media having holographically recorded data thereon; a holographic copy media; a light source for generating a master reference beam and a copy reference beam, coherent with the first object beam, the first master reference beam incident on the holographic master media, the holographic master media diffracting the master reference beam to provide a first object beam; the copy reference beam incident on the holographic copy media; and a first optical relay system, disposed between the holographic master media and the holographic copy media, for relaying the first object beam from the holographic master media to the holographic copy media, the holographic copy media recording an interference pattern between the first object beam and the copy reference beam, thereby replicating at least a portion of holographically recorded data.

38 Claims, 8 Drawing Sheets

REPLICATION OF DATA TO HOLOGRAPHIC MEDIUM USING HOLOGRAPHIC MASTER MEDIA

RELATED APPLICATIONS

This application is a continuation of International Application No. PCT/US2004/044017, which designated the United States and was filed on Dec. 30, 2004, published in English, which claims the benefit of U.S. Provisional Application No. 60/533,296, filed on Dec. 30, 2003. The entire teachings of the above application are incorporated herein by reference.

BACKGROUND OF THE INVENTION

Holographic data storage is advantageous due to its promise of high data densities and high data rates, achievable through the volume storage of data within a suitable optical material. As in any data storage system or media, a key parameter governing its application is its cost. For data that is circulated as read-only, such as computer operating systems, software, videos, etc., one requires, among other things, that the ability to replicate the data contained within the data storage medium is inexpensive. For read/write data storage media, one still, in general, requires that the media be recorded with some form of formatting or tracking marks. For example, a writeable compact disk (CD) is not truly blank, but contains track marks in order to facilitate the writing of data at some later point in time. Therefore, for a holographic data storage medium to be considered advantageously as a read/write or read only product, and the data storage system designed to operate so as to servo from the medium, needs to replicate such servo marks in a cost-effective manner at the factory level.

SUMMARY OF THE INVENTION

This invention relates to a method and apparatus for replicating holographic media to be used in a data storage system comprising a holographic data storage system (HDSS).

In one embodiment, the present invention is an apparatus for replicating holographically recorded data. The apparatus comprises a holographic master media having holographically recorded data thereon; a holographic copy media; and a light source. The light source generates a master reference beam, incident on the holographic master media. The holographic master media diffracts the master reference beam to provide a first object beam. The light source further generates a copy reference beam, coherent with the first object beam and incident on the holographic copy media. The apparatus further includes a first optical relay system, disposed between the holographic master media and the holographic copy media, for relaying the first object beam from the holographic master media to the holographic copy media, the holographic copy media recording an interference pattern between the first object beam and the copy reference beam, thereby replicating at least a portion of holographically recorded data.

In another embodiment, the present invention is an apparatus for replicating holographically recorded data. The apparatus comprises a first holographic master media having holographically recorded data thereon; a second holographic master media having holographically recorded data thereon; a light source, having tunable wavelength, for generating first and second master reference beams incident on the first and the second holographic master media, respectively, thereby generating first and second object beams; a holographic copy media; a first optical relay system, disposed between the first holographic master media and the holographic copy media, for relaying the first object beam from the first holographic master media to the holographic copy media; and a second optical relay system, disposed between the second holographic master media and the holographic copy media, for relaying the second object beam from the second holographic master media to the holographic copy media. In this embodiment, the interference between the first and the second object beams is recorded in the holographic copy media thereby replicating at least a portion of holographically recorded data.

In another embodiment, the present invention is an apparatus for replicating data. The apparatus comprises a master mask media having structural data features thereon; a light source, having a tunable wavelength, for generating a master reference beam, incident on the master mask media, thereby generating a first object beam; and a first copy-reference-beam-generating system. The first copy-reference-beam-generating system includes a holographic copy media; a first optical relay system, disposed between the master mask media and the holographic copy media, for relaying the first object beam from the master mask media to the holographic copy media; a reflective surface; and a second optical relay system disposed between the holographic copy media and the reflective surface so that the optical axis of the second optical relay system is coincident with the optical axis of the first optical relay system. The second optical relay system relays a portion of the first object beam transmitted by the holographic copy media to the reflective surface, the reflective surface reflects the transmitted portion of the object beam at the holographic copy media, thereby generating a copy reference beam, the holographic copy media records an interference pattern between the first object beam and the copy reference beam, thereby replicating at least a portion of the mask data.

In another embodiment, the present invention is an apparatus for replicating data. The apparatus comprises a first master mask media having structural data features thereon; a second master mask media having structural data features thereon; a light source, having tunable wavelength, for generating first and second master reference beams incident on the first and the second holographic master media, respectively, thereby generating first and second object beams; and a holographic copy media. The apparatus further includes a first optical relay system, disposed between the first master mask media and the holographic copy media, for relaying the first object beam from the first master mask media to the holographic copy media; and a second optical relay system, disposed between the second master mask media and the holographic copy media, for relaying the second object beam from the second master mask media to the holographic copy media. The interference between the first and the second object beams is recorded in the holographic copy media thereby replicating at least a portion of mask data.

In another embodiment, the present invention is a method of replicating holographically recorded data. The method comprises generating a master reference beam by a light source; directing the master reference beam at a holographic master media having holographically recorded data thereon, thereby generating a first object beam; directing the first object beam at a holographic copy media through a first optical relay system, disposed between the holographic master media and the holographic copy media; generating a copy reference beam by the light source; and directing a copy reference beam, coherent with the object beam, at the holographic copy media, thereby recording an interference pattern between the object beam and the copy reference beam thereby replicating at least a portion of holographically recorded data.

In another embodiment, the present invention is a method of recording at least one layer of holographic data within holographic recording media. The method comprises generating a master reference beam by at least one light source; directing a master reference beam at a holographic master media having holographically recorded data thereon or at a master mask media having structural data features thereon, thereby generating a first object beam; relaying the first object beam from the holographic master media or master mask media to a first holographic copy media; relaying a portion of the first object beam transmitted by the first holographic copy media to a first reflective surface, the first reflective surface reflecting the transmitted portion of the first object beam at the first holographic copy media to generate a first copy reference beam; and relaying the first copy reference beam to intersect with the first object beam at the holographic copy media, thereby recording an interference pattern between the first copy reference beam and the first object beam and replicating at least a portion of holographically recorded data or mask data.

In another embodiment, the present invention is a method for replicating holographically recorded data or mask data. The method comprises generating a first and a second master reference beam by at least one light source; directing a first master reference beam at a first holographic master media or master mask media, thereby generating a first object beam; directing the first object beam at a holographic copy media through a first optical relay system, disposed between the first holographic master media or master mask media and the holographic copy media; directing a second master reference beam at a second holographic master media or master mask media, thereby generating a second object beam; directing the second object beam at the holographic copy media through a second optical relay system, disposed between the second holographic master media or master mask media and the holographic copy media; and recording in the holographic copy media the interference pattern between the said first and the second object beams.

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

This invention relates to a method and apparatus for replicating holographic media to be used in a data storage system comprising a holographic data storage system (HDSS). The disclosed method and apparatus can be used to pre-format read/write holographic media at the factory level or to replicate read only holographic media.

The method and apparatus of this invention comprises a novel and advantageous method for replicating volume holographic data from a holographic master to form one or more of a holographic copy media. For read/write holographic media, the amount of data that needs to be copied may consist of only a minimal amount of data, such as the data required to provide for tracking information or information describing material and/or system data or parameters, which, by way of example may be age, recording sensitivity, and thickness of the photosensitive media, the specific data format being used, etc. In the case of a read-only memory (ROM) device, the information to be replicated onto the media may consist of significantly more data that, by way of example, may be a few gigabytes to multiple terabytes).

The apparatus and method of this invention comprises an optical lithography system that projects the diffracted data from a holographic master comprising information stored as volume holograms to a recording medium, herein referred to as the holographic copy media that contains material into which volume holographic data can be recorded and stored. In the description of the invention herein, the holographic master and copy media are drawn for convenience as comprising two planar substrates sandwiching an optical material into which volume holographic data can be recorded and stored. Such geometry would be representative of a volume holographic medium that comprises a photopolymerizable volume holographic recording material, such as those available from Aprilis, Inc. (Maynard, Mass.). With this media, one generally sandwiches the photopolymerizable recording material between two planar substrates that are composed of, for example, glass or plastic or combinations thereof. The drawings of the holographic master and copy media of this invention should be treated as general schematics, and as such are meant to cover all other geometries and configurations of holographic masters and copies. For example, the drawings are meant to cover holographic masters and copies that incorporate photorefractive crystals and polymers, photochromic materials, and the like that may or may not require any additional substrates attached to them.

In the replication system of this invention, the holographic master is illuminated by at least one reference beam, which generates by diffraction at least one object beam. This object beam contains the data one desires to have holographically recorded into said holographic copy media. Said diffracted object beam is relayed by an optical system to said holographic copy media. The relaying of the optical information in the object beam can be, but is not required to be, an imaging function such that the two conjugate imaging planes are a plane of the holographic master and a plane of the holographic copy media, respectively. Other types of optical systems are also contemplated for relaying of the optical information in the object beam to the plane of the holographic copy media. In order to record a hologram in said holographic copy media, a reference beam illuminates the holographic copy media in the same location and at the same time as the relayed object beam. One requirement on the object and reference beams for recording in the holographic copy media is that these two beams, at every point of interference in the photosensitive medium of the holographic copy media, are substantially optically coherent relative to each other. The conventional method of achieving this requirement is to have the same light source (for example a laser) create both the object and reference beam for recording in said holographic copy media. Consequently, the optical system of the replication system and method of this invention requires that the path length difference of the reference and object beams at any point in the photosensitive medium of said holographic copy media be such that it is substantially within the coherence length of the light source. For example, the path length difference can be within 20%, 10%, 5%, 1% or, preferably, less than 1% of the coherence length of the light source.

As used herein, the term "coherence length" refers to the propagation distance from a coherent source to a point where an electromagnetic wave maintains a specified degree of coherence. In optical communications, the coherence length, L, is given approximately by $L=\lambda^2/(n\Delta\lambda)$ where $\lambda$ is the central wavelength of the source, n is the refractive index of the medium, and $\Delta\lambda$ is the spectral width of the source.

Figure 1:
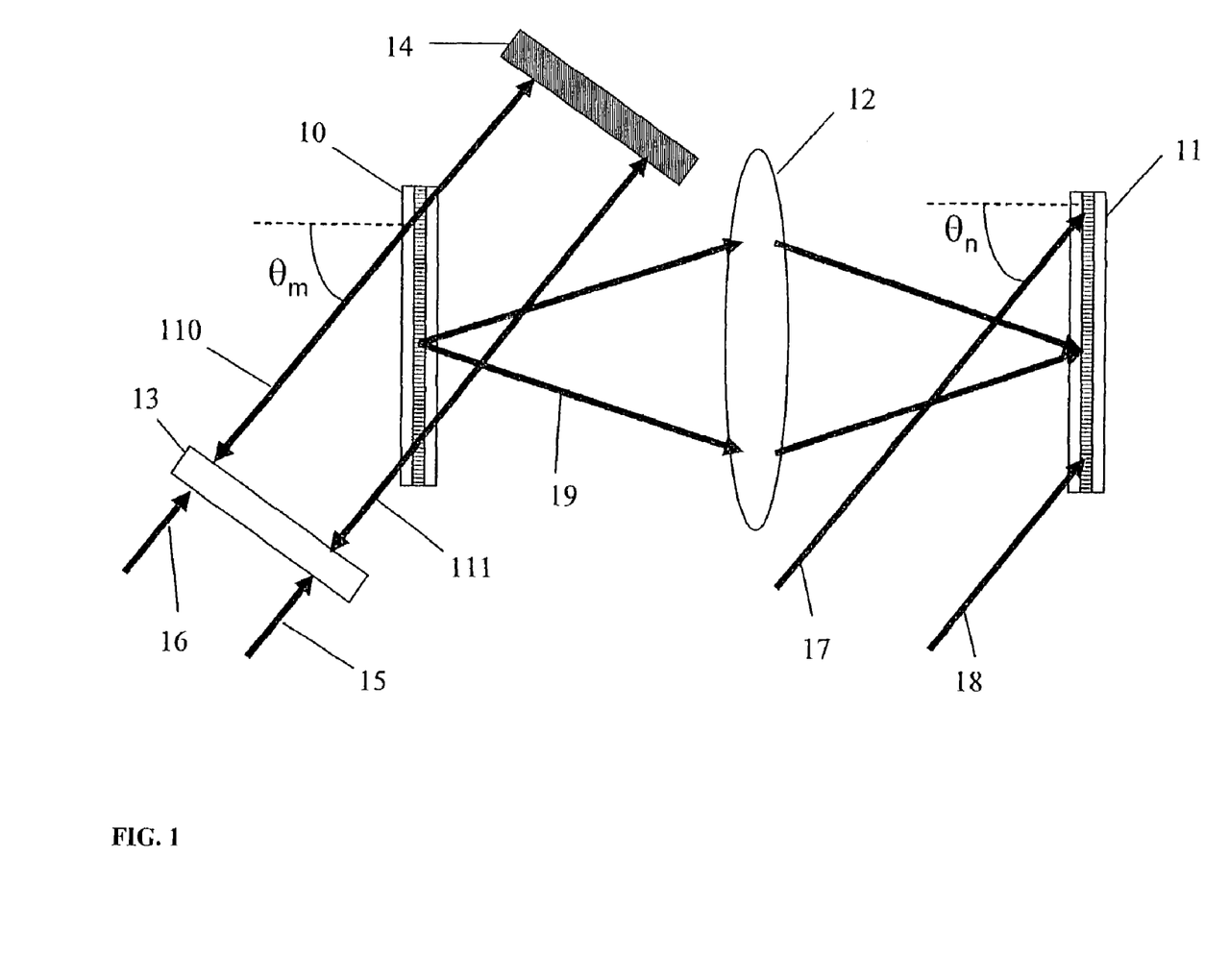
FIG. 1 illustrates an embodiment of an apparatus of the instant invention, wherein an optical relay system is used to relay the optical data contained within the holographic master to a holographic copy.

FIG. 1 represents one preferred embodiment of a method and apparatus for a replication system for an angle or peristrophic-multiplexed holographic media. An optical relay system (12) is used to image the light from the holographic master (10) to a photosensitive volume holographic recording media, referred to as the holographic copy media (11). The holographic master is illuminated by a reference beam that is bounded by rays (15) and (16). The rays (15) and (16) transmit through a partial reflector (13), transmit through the holographic master (10), and then are reflected back by mirror (14). The partial reflector (13) and the mirror (14) create a resonant cavity in which the reference beam bounded by rays (110) and (111) resonates inside of the cavity some multiple of times. A method of enhancing the diffraction efficiency of a hologram by placing it inside a resonant optical cavity has been described by Sinha and Barbastathis in Optics Letters, Vol. 27, No. 6, pp 385-387 (2002). The resonant cavity, though not required for the replication system of this invention, operates to advantageously achieve significantly higher diffraction efficiencies from the holographic master than could otherwise be achieved for a given input laser power. By way of example, instead of a fraction of a percent, the diffraction efficiencies can exceed 10% and even more preferably 50%. Incorporating the resonant cavity provides for achieving advantageous replication throughputs that can be substantially higher. The light diffracted from the holographic master, herein referred to as the object beam, is imaged using an imaging system (12) onto the holographic copy media (11).

The optical relay system (12) can be composed of a plurality of optical elements (reflective, diffractive, and/or reflective) in order to produce the necessary imaging condition. The magnification of the system need not be 1:1, but instead can in general magnify or demagnify the holographic master onto the holographic copy. In a preferred embodiment, the light diffracted from the holographic master is relayed such that the virtual source of the diffracted light (which may or may not be a point located within the holographic master) is imaged by an optical system (12) that is telecentric in object and/or image space. As used herein, the term "telecentricity" refers to a special property of certain multi-element lens designs in which the chief rays for all points across the object or image are collimated. For example, telecentricity occurs when the chief rays are parallel to the optical axis, in object and/or image space. As used herein, the term "chief ray" refers to a ray passing through the center of the lens. As used herein, the term "telecentric lens" refers two a lens in which the aperture stop is located at the front focus, resulting in the chief rays being parallel to the optical axis in image space. In the context of the present invention, the telecentricity condition provides for a more robust optical system in that the system is not susceptible to magnification errors when either the holographic copy or master are moved along the direction of the optical axis of the optical relay system.

In the preferred embodiment, the reference beam for the holographic copy is split from the same laser as that for the reference beam for the holographic master. The optical system operates in a manner such that the path length difference between the laser, passing into the resonant cavity though the holographic master (10) to the opposing reflective $2^{nd}$ surface (14) of the cavity and reflected back through the holographic master (10) to the partially reflective first surface (13) of the cavity and then reflected back through the holographic master and then being diffracted to the holographic copy media, and the path length from the laser beam to the holographic copy media (called the reference beam) is within the coherence length of the laser. The path length difference must also be preferably within the coherence length of the laser when multiples passes occur within the resonant cavity. The reference beam for the holographic copy media is bounded by rays (17) and (18). Though drawn in FIG. 1 as being incident on the same side of the holographic copy as the diffracted light relayed from the holographic master, the reference beam for the copy can in general be incident from either side of the holographic copy media. The reference beam for the copy can be any arbitrary wavefront. Therefore, this beam could be, but is not limited to, plane waves, approximate plane waves, spherically converging or diverging beams, and could also be modulated in phase such as by use of orthogonal phase encoding or random phase encoding or combinations thereof. Other types of wavefronts are also contemplated and as such are within the scope and spirit of the invention. The reference beam for the master can also be any arbitrary wavefront and the two reference beams used in a single exposure of the holographic copy need not be the same reference beam. For example, if the reference beam illuminating the holographic master is a plane wave at an angle $\theta$, the reference beam illuminating the holographic copy could be a plane wave at another angle $\phi$, but alternatively, by way of example, could be a diverging or converging spherical beam.

The schematic of FIG. 1 depicts the reference beam as being incident upon the holographic master so as to provide for diffracted light in a forward direction and is hence representing a transmission hologram. This represents only one embodiment of the holographic master. In an alternative embodiment the holographic master may instead comprise one or more reflection holograms. In such a case, the master reference beam would enter the resonant cavity through partially reflective surfaces (13) or (14) and would propagate within the cavity some multiple of times from said surface (14) through the holographic master (10) to partially reflective surface (13) and back through the holographic master (10) to said surface (14), such that the reflected diffracted beam from the light directed by surface (14) to the holographic master (10) is captured by the optical relay system (12) and imaged onto holographic copy media (11).

In still another embodiment (see FIG. 2) the apparatus and method of this invention operates so as to provide for replication of a holographic master to two holographic copy media simultaneously. In this embodiment a second relay system (12a) and second holographic copy media (11a) is positioned in a symmetric relationship and opposing orientation (i.e. to the left of the cavity in the depiction of FIG. 1) to the resonant optical cavity of FIG. 1 so that the optical axis of the second relay system (12a) and the first relay system (12) are along the same axis. In the case where the holographic master (10) comprises transmission holograms then light directed from said surface (14) of the said cavity toward the holographic master (10) is redirected by said master (10) by transmission diffraction to said second relay system (12a) and then imaged by said relay system (12a) onto said $2^{nd}$ holographic copy media (11a). This embodiment provides for holographic recording by illuminating the holographic copy media (11a) with a reference beam bounded by rays (17a) and (18a). In the preferred embodiment, said reference beam, the reference beam illuminating holographic copy media 11 bounded by rays (17) and (18), and the object beam bounded by rays (15) and originate from the same optical source (for example a laser) and the relative path length differences between the two reference beams and the object beams (19 and 19a) at the selected point of interference at the respective holographic copy media is substantially within the coherence length of said optical source. In the case where the holographic master (10) comprises reflection holograms then light directed from said surface (13) of the said cavity toward the holographic master (10) is redirected by said master (10) by reflection diffraction to said second relay system (12a) and then imaged by said relay system (12a) onto said $2^{nd}$ holographic copy media (11a). Alternatively, the optical axis of the symmetric system could be folded to be along another axis from that of the first system depicted in FIG. 1. Alternately, the reference beams illuminating the holographic copy media 11 and 11a can be incident from the opposite side of said respective media from the respective object beams 19 and 19a such that the dual holographic copy media replication system is used to create replica reflective holograms.

Generally, in order to transfer all of the data contained within the holographic master into the holographic copy, the reference beam illuminating the holographic master must be changed to select all of the reference beams that were used to record the data so as to fully access all of the data that are multiplexed in the holographic master. By way of example, for a holographic master comprising data that is angle and/or peristrophically multiplexed, the incident angle of the reference beam is changed by an amount that is related to the Bragg selectivity of the recorded holograms. When selecting a new reference beam angle, the resonator cavity comprised of components (13) and (14) operates so as to rotate to the new position along with the incident beam, bounded by rays (15) and (16). In an alternative embodiment, for a holographic master that contains wavelength-multiplexed data, the wavelength illuminating the holographic master is changed by an amount that is related to the wavelength selectivity of the recorded holograms. Alternatively, for a holographic master that is spatially multiplexed, the position of the incident reference beam is changed in order to address additional data contained within the holographic master. The holographic master may additionally be phase encoded, for example with orthogonal phase codes, such that in order to play back a set of stored holographic data, one must know the exact phase encoding required for that particular reference beam. Such an encoding scheme for the reference beam would be advantageous for the master, in that it would provide barriers for piracy and counterfeiting efforts. The described embodiment of the present invention is meant to cover all forms of replaying multiplexed holographic data from a holographic master that could be conceived of by one skilled in the art.

The angles of the reference beams illuminating the holographic master and the holographic copy media do not have to match. In one embodiment of the apparatus and method of this invention, and as depicted schematically in FIG. 1, a given angle $\theta_m$ that illuminates the master to read out a certain set of holographic data can be recorded into the holographic copy using a reference beam of a different angle $\theta_n$. Since the two angles $\theta_m$ and $\theta_n$ do not have to be equal, the relationship between the two angles can be coded, which may be advantageous for some applications in which piracy and/or counterfeiting is a concern.

In still another embodiment, that is a variation of the embodiment shown in FIG. 1, a resonant cavity is not used. Therefore, mirror (14) and partial reflector (13) are not present in this embodiment. Instead, rays (15) and (16) are incident directly upon the master hologram (10).

Figure 2:
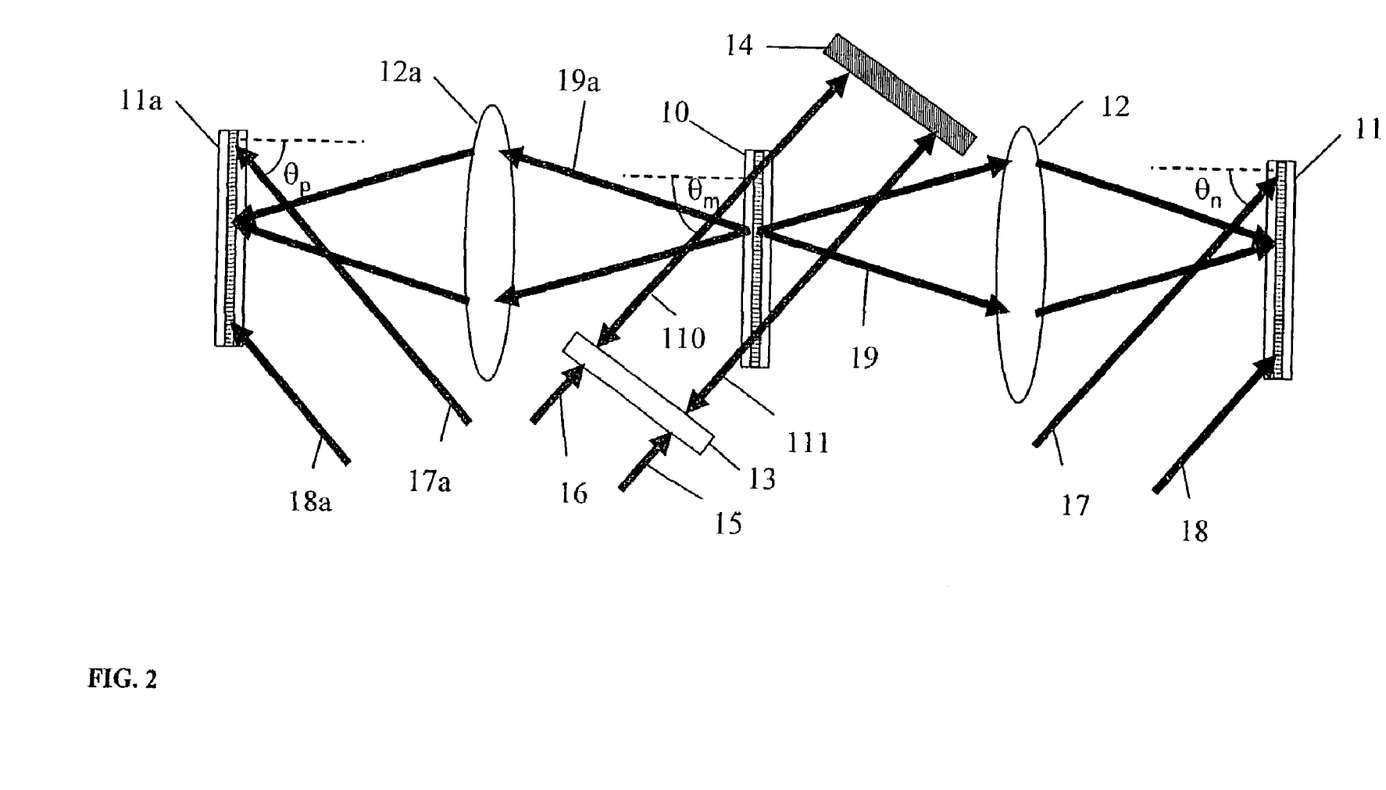
FIG. 2 illustrates another embodiment of an apparatus of the present invention wherein the phase conjugate diffraction of holographic master is relayed by an additional optical relay system such that a second holographic copy media is recorded simultaneously with the first holographic copy media.

Embodiments, such as the one illustrated in FIG. 1 and FIG. 2, are particularly useful for a card-based HDSS in which the reference beam can always be incident from one side of the substrate. For a disk-based HDSS, it is desirable that the reference beams used in recording the holographic copy media have some symmetry relative to the center of rotation of the disk. By way of example, for holographic media that is intended to use angle and peristrophic-multiplexing, it is desirable that the holographic copy media be illuminated by plane waves that are symmetrically arranged relative to the center of the disk. One method of achieving this arrangement of reference beams is to use an axicon. As used herein, the terms "axicon" or "axicon lens" refer to a conical lens a.k.a. a rotationally symmetric prism. Axicon can be used to convert a parallel laser beam into a ring, to create a non diffractive Bessel beam or to focus a parallel beam into long focus depth.

Figure 3:
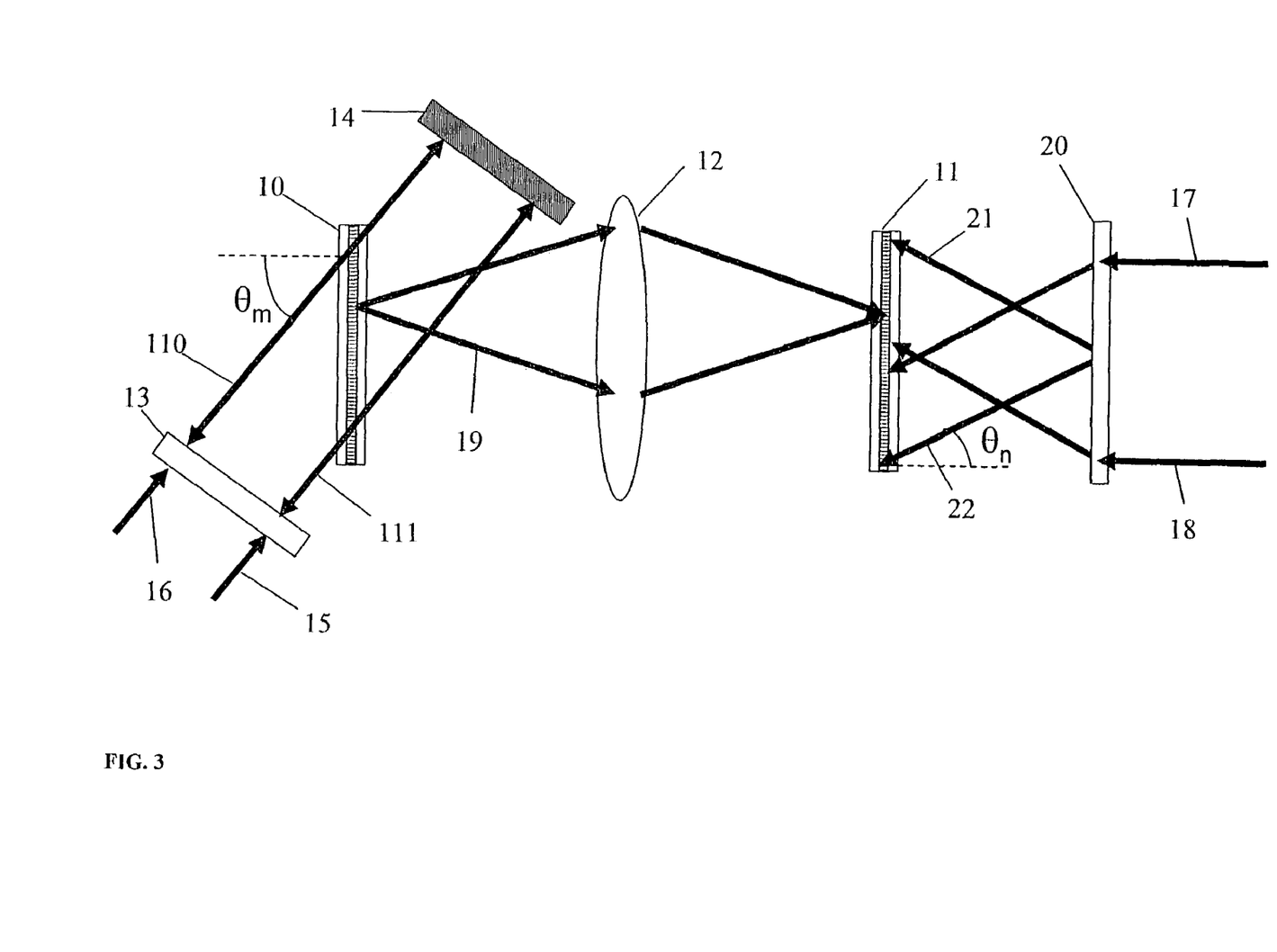
FIG. 3 illustrates an embodiment of a replication system of the present invention that incorporates a beam steering system that is used to create the required array of reference beams on the holographic copy.

FIG. 3 illustrates an embodiment of the present invention that incorporates a beam steering system (20). This embodiment relates to the embodiment illustrated in FIG. 1, wherein the optical data stored in a holographic master (10) is relayed by an optical system (12) onto a holographic copy (11). The modification of the method and apparatus of FIG. 1 relates to the form of the reference beam illuminating the holographic copy. The reference beam, bound by rays (17) and (18), illuminates the beam steering system (20) which creates a new arrangement of reference beams, bound by rays (21) and (22) that illuminate the holographic copy media. The reference beams illuminating the holographic copy media can have any arbitrary distribution and/or wavefront that is advantageous for the final product and those experienced in the art will consider the various advantages and disadvantages in making the optimum choice. The beam steering system (20) can be composed of a combination of refractive, reflective, Fresnel, or diffractive optical elements. For the case described earlier of the holographic copy media being in the form of a disk and the holographic data being stored via angle multiplexing, the beam steering system (20) can consist of a single optical element that is an axicon so as to achieve the required array of plane reference beams that propagate radially with respect to the center of the disk. For this reason, the rays immediately to the left of the beam steering system (20) in FIG. 3 are drawn to represent rays that an axicon would create, though the use of the beam steering system (20) extends generally to a plurality of reference beam distributions and/or wavefronts. In order to multiplex all of the required data into the holographic copy, one requires that the angle of the conical beam emerging from the axicon is changed by discrete angles, and that each angle is generally separated from the others such that the angular separation equals or exceeds the Bragg angular selectivity for the particular holographic copy being used. One can use multiple axicons that are switched in and out for the recording process, but a preferred embodiment of the present invention is to use a beam steering system that comprises a zoom axicon. Much like a zoom lens system that changes optical power, a zoom axicon system has multiple optical elements, one or more are moved simultaneously in or to change the angle of the conical beam that is produced.

Figure 4:
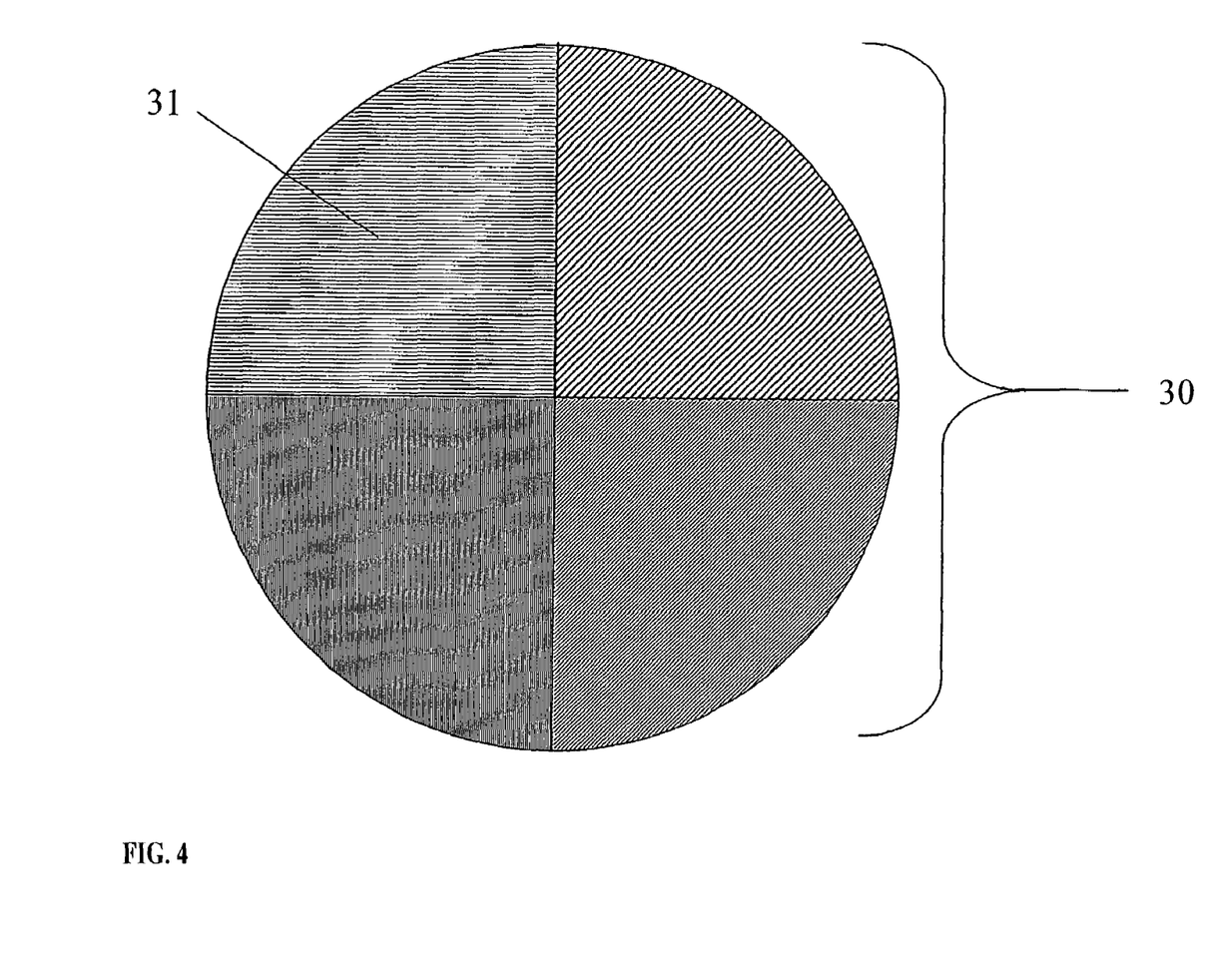
FIG. 4 shows an angularly segmented axicon that can be used to implement a beam steering system as shown in FIG. 3.

In still another embodiment of the present invention for producing multiple axicon-type beams is the use of an angularly segmented axicon plate. The segmentation can be done using refractive, Fresnel, or diffractive elements. FIG. 4 depicts schematically an example of an angularly segmented axicon (30). Four wedges of axicon segments (31) are illustrated but, in general, any number n can be implemented. The n number of axicon segments operate to bend the incident light at a different angles $\theta_n$ towards the holographic copy media, where each of the $\theta_n$ angles is preferably separated relative to each other by at least the angular Bragg selectivity requirements of the holographic copy media. The number n is chosen according to the number of angle-multiplexed holograms that are required in order to record all the required data into the holographic copy media. An example of a recording process that uses such an angularly segmented axicon is to first make one recording of data with the angularly segmented axicon oriented in one clocking orientation. For the next set of multiplexed data to be recorded, the reference beam illuminating the holographic master is changed so as to diffract the next set of object beams and said angularly segmented axicon is rotated by an angle of 360°/n. The exposure process is completed once each location on the holographic copy media has been exposed to all of the different types of reference beams created by the different segments of the axicon. An advantage of this embodiment is that one needs only to rotate the segmented axicon in order to achieve the required reference beams for the holographic copy media and such rotary motion is fast and additionally is a relatively simple movement that can be precisely controlled.

Although the previous discussion centered about an angularly segmented beam steering component that produces a set of axicon wavefronts, this embodiment also contemplates other beam steering systems that allow for a rotation of one or more optical components so as to scan through the set of reference beams required for recording the data into the holographic copy media.

In still another embodiment, that extends to all of the holographic replication systems of the present invention, the addressing of new data in the holographic master can be achieved, not only by physically moving or changing the reference beam, but also by changing the wavelength of the reference beam. By way of example, one can have the reference beam for the holographic master and that of the holographic copy media originate from a wavelength tunable source. This wavelength tunable source can be created through the use of a source that itself is tunable (for example a semiconductor laser that through an external cavity or temperature control can be wavelength tuned or a tunable dye laser), or a source that consists of a collection of wavelengths. By way of example, the source may consist of several separate wavelength sources such as several different lasers, or may consist of a single broadband source in which one selects specific wavelengths through the use of a component such as a thin-filter or a diffraction grating.

Figure 5:
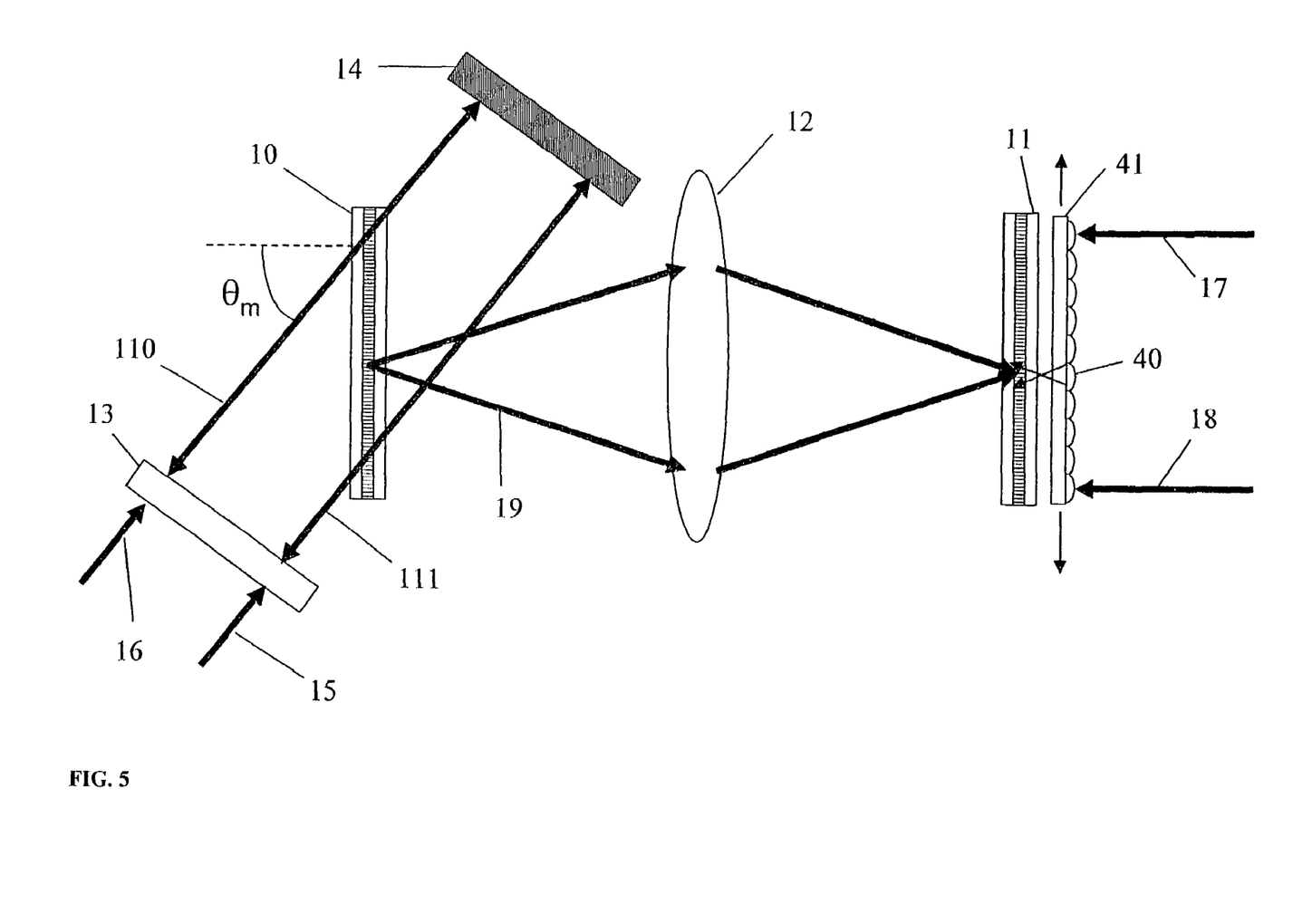
FIG. 5 illustrates an embodiment of a beam steering substrate as shown in FIG. 3 that incorporates an array of microlenses.

In one aspect of this invention a beam steering substrate (41) that contains an array of microlenses (40), such as is depicted in FIG. 5, is used for the replication of shift-multiplexed holograms. In this case the incident reference beam bound by rays (17) and (18) is focused by the microlenses, thereby creating a multitude of spherical wavefronts or, alternatively, other non plane-wave wavefronts, that are incident upon the holographic copy media (11). In order to multiplex multiple sets of data in the holographic copy media said beam steering element (41) is operated so as to be translated in a direction that is tangent to the surface of the holographic copy to provide for multiplexing multiple sets of data in the holographic copy media. Those experienced in the art will be able to choose an appropriate shift increment for said translation, which, by way of example, depends upon the thickness of the holographic copy media, the distance between said media and the focus position of said microlenses and the interbeam angle between spherical wavefront and the reconstructed object beams from the holographic master.

Figure 6:
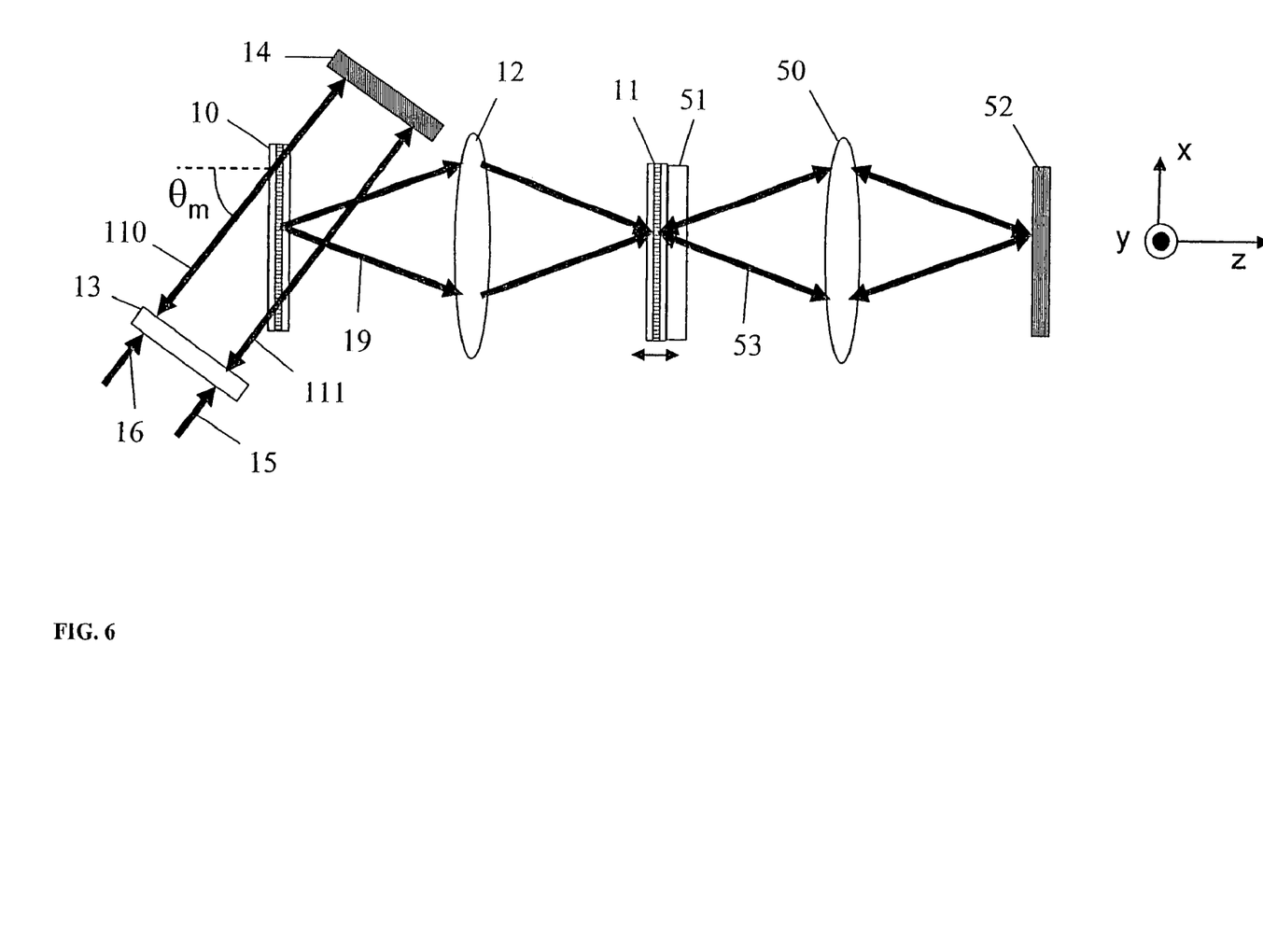
FIG. 6 illustrates an embodiment of a replication system of the present invention that records reflection microholograms in a holographic copy using a reflecting surface.

For bit-based system, there are number of other embodiments of the method and apparatus of the present invention. These are general adaptations to a general holographic replication system that relays the optical information stored in a holographic master so as to record said information in holographic copy media. By way of example, FIG. 6 illustrates a holographic replication system that operates to provide for recording reflection micro-holograms in a holographic copy media (11). Said micro-hologram reflection gratings are recorded by providing for overlap in the beam waist of counter-propagating focused beams as described by Eichler et al. in IEEE Journal of Selected Topics in Quantum Electronics, Vol. 4, No. 5, pp 840-848 (1998) and incorporated by reference herein. In this embodiment of a holographic replication system, the object beam (19) diffracted from the holographic master (10) is relayed by an optical system (12) onto a holographic copy media (11). Holographic copy media (11) is supported by transparent reference platen (51), such as a vacuum chuck, that rigidifies the surface of media (11). The holographic copy media is transmissive, and allows the relayed object beam (53) to be transmitted and relayed by an optical system (50) onto a reflective surface (52). The optical system (50) is designed such that the reflective surface will reflect the light back onto the holographic copy media such that the reflected light is aligned with respect to the initial relayed object beam. In this manner, the diffracted light from the holographic master serves to generate the object beam and the reference beam for the holographic copy media. In a preferred embodiment, the light diffracted from the holographic master is relayed such that the virtual source of the diffracted light (which may or may not be a point located within the holographic master) is imaged by an optical system (12) that is telecentric in at least imaging space, but preferentially in object space as well. The telecentricity condition provides for the optical relay system (12) to be less sensitive to the movement of the holographic master or copy media when they are moved along a direction parallel to the optic axis of the optical relay system. The second optical relay system (50) is preferentially a telecentric imaging system (for example, a 4f optical system) that images a specific plane of the holographic copy to the plane of the reflective surface (52). The telecentricity requirement allows the light reflected by the reflective surface to be imaged back onto the source point of the holographic copy in which the light originated. In this manner, two counter-propagating beams interfere in the overlap volume of their respective beam waists at the desired z-plane of the holographic copy so as to create the desired series of micro-holograms that record the data of interest. Since micro-holograms are produced along a length in z of only a few microns, described by Eichler et al. as an interaction length $l=(2A_{b_w}n\lambda)$ for $A_{b_w}$ being the area at the beam waist, n the refractive index, and l the wavelength, multiple microhologram layers can be recorded in the z-dimension of the holographic copy media, said layers having a separation distance along the z-dimension of at least the interaction length. In one embodiment, multiple layers of micro-hologram data are recorded by changing the incident beam illuminating the holographic master such that a new set of data is diffracted from said master (for instance by changing the angle $\theta_m$ in the case of an angle-multiplexed holographic master) and by simultaneously shifting the holographic copy in said z-dimension by a distance such that the recorded microholograms layers are recorded in different volumes along the z-dimension. Alternatively, the recorded microholograms can also be multiplexed in said interaction length at a selected z-dimension, such as by changing the wavelength for the incident beam illuminating the holographic master and holographic copy media, so that each said layer at a selected z-dimension comprises multiplexed microholograms.

Figure 7:
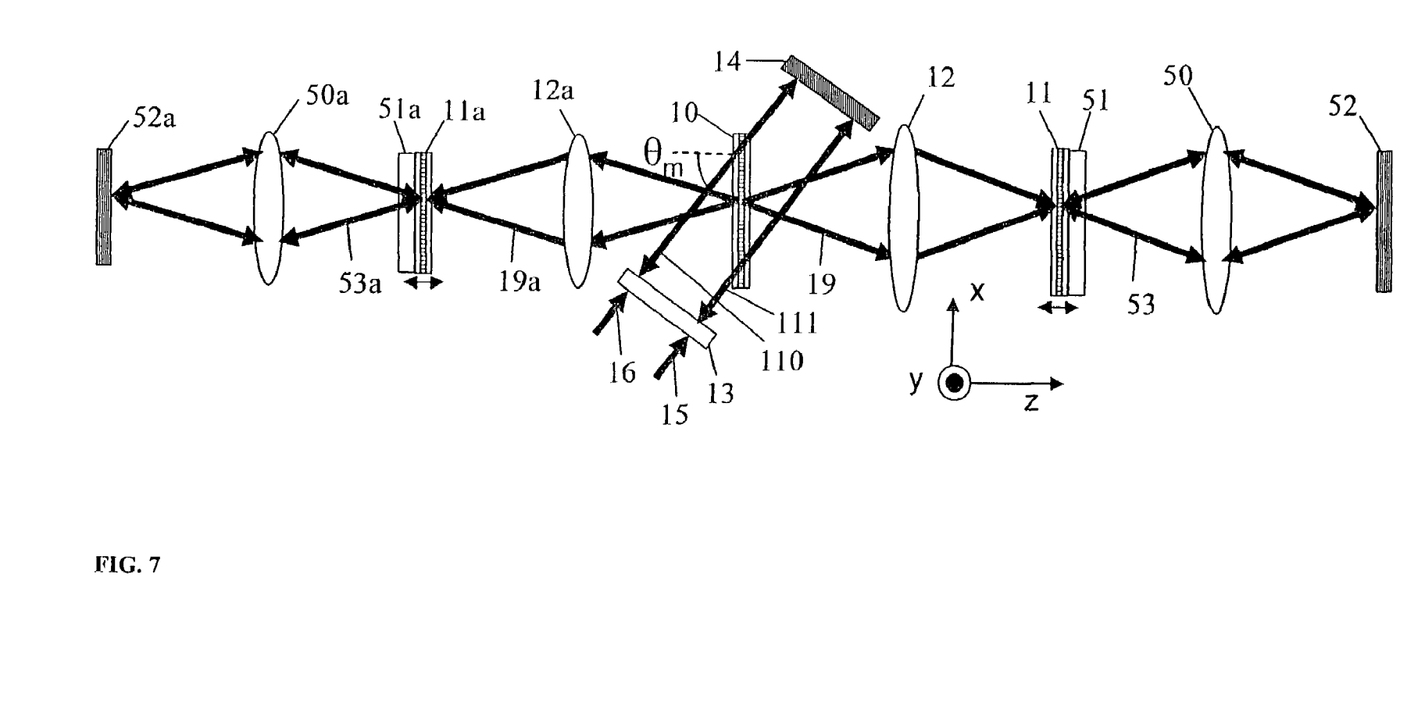
FIG. 7 illustrates an embodiment of a replication system of the present invention that records reflection microholograms simultaneously in two holographic copy media.

In another aspect of this invention, the holographic master and resonant cavity depicted in FIG. 6 can be replaced by a transmission mask or a reflection mask that is capable of producing the point-type sources of light that are required for the creation of said micro-hologram. In still another embodiment the apparatus and method of this invention depicted in FIG. 6 operates so as to provide for replication of a holographic master to two holographic copy media simultaneously, see FIG. 7. In this embodiment another relay system (12a) and a second holographic copy media (11a) is positioned in a symmetric relationship and opposing orientation (i.e. to the left of the cavity in the depiction of FIG. 6) to the resonant optical cavity of FIG. 6 so that the optical axis of the second relay system (12a) and the first relay system (12) are optionally along the same axis. Similarly the object beam (53a) is transmitted by the holographic copy media (11a) and relayed by an optical system (50a) onto a reflective surface (52a), again so that the optical axis of the symmetric system is along that of the first depicted system. Alternatively, the optical axis of the symmetric system could be folded to be along another axis from that of the first system depicted in FIG. 6.

Figure 8:
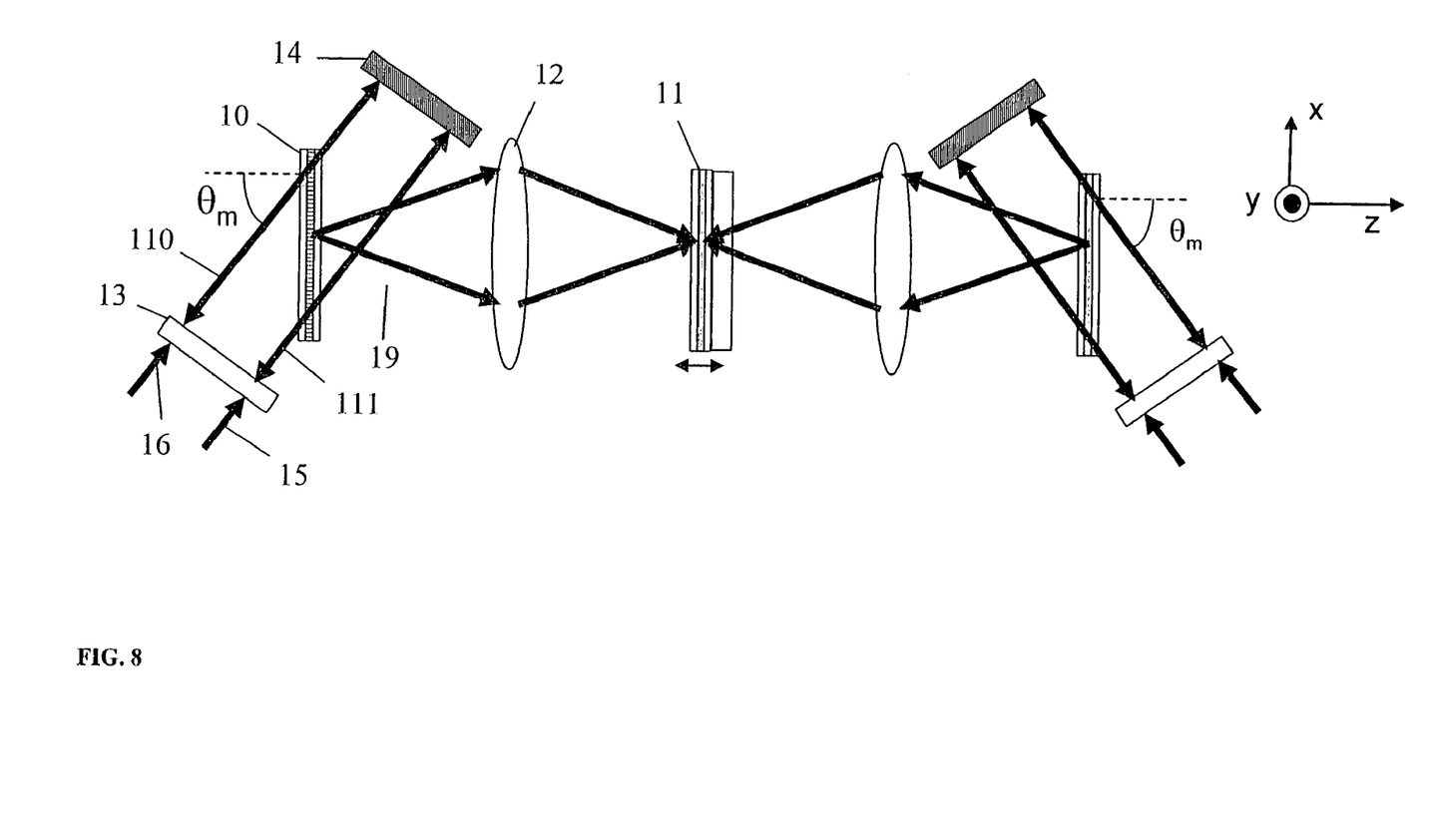
FIG. 8 illustrates an embodiment of a replication system of the present invention that records reflection microholograms using two holographic masters media, each associated with a resonant optical cavity and optical relay system.

In still another aspect of the present invention, two counter-propagating focused beams are formed so as to overlap at or near their respective beam waists by use of two holographic masters, each said holographic master being associated with its own optical relay system and, optionally, with its own resonant optical cavity that operate to record one or more reflection microholograms at a selected z-dimension in a holographic copy media. By way of example, FIG. 8 depicts schematically a method and apparatus of such a embodiment of a replication system with optional resonant optical cavities.

Other embodiments of the method and apparatus of this invention for recording and replicating holographic data are contemplated by the present invention and as such the extent of the present invention is not limited to the specifics described herein. It is noted that one skilled in the art can conceive of numerous alterations to the embodiments described that are within the spirit of the present invention. Such alterations to a replication system that utilizes an optical relay system to relay the optical information stored in a holographic master or master mask to a holographic copy media are within the scope and spirit of the present invention regardless of the type of multiplexing used to read out the master hologram or mask or the type of multiplexing that is used to record the information in the holographic copy or the exact design of said replication system.

There are numerous embodiments of the method and apparatus of the replication system of this invention that can be used to replicate holographic media and although these may be alternative embodiments to those disclosed by this invention, they are within the scope of the present invention. Various changes, substitutions and alterations can be made therein without departing from the spirit and scope of the present invention. The embodiments of the present invention relate to holographic replication systems that produce holographic copies which are angle-multiplexed or peristrophic-multiplexed (otherwise referred to as azimuthal-multiplexed) or shift-multiplexed or spatial-multiplexed or spatioangular multiplexed or phase multiplexed or speckle multiplexed, or a combination of two or more of these or other multiplexing schemes. The holographic data recorded can be in the form of digital pages (e.g., 256×256, 512×512, 1024×1024, 1×1024, etc.) or can be bit-based as accomplished with micro-reflection holograms, thereby providing for a data format that may be similar to that of compact disks (CDs) and digital versatile disks (DVDs).

Embodiments of the apparatus and method of the present invention also relate to holographic replication systems that can replicate in one exposure step the complete data as well as the partial data stored in a holographic master. In the case of partial replication during an exposure, the complete exposure may be achieved through spatial movement of the optical system, the holographic master, and/or the holographic copy. The complete replication may be achieved as well by illuminating the holographic master with a set of different reference beams (one for each exposure step), that can be concurrently or sequentially illuminating the holographic master, in order to reconstruct (play back) and then record the full data stored in the holographic master. Said different reference beams may be differentiated, by way of example, according to a number of multiplexing schemes known in the literature such as, for example, incident angle, position of the reference beam, wavelength, or its wavefront.

While this invention has been particularly shown and described with references to preferred embodiments thereof, it will be understood by those skilled in the art that various changes in form and details may be made therein without departing from the scope of the invention encompassed by the appended claims.

What is claimed is:

1. An apparatus for replicating holographically recorded data, comprising:
    a holographic master media having holographically recorded data thereon;
    a holographic copy media;
    a light source for generating a master reference beam, incident on the holographic master media, the holographic master media diffracting the master reference beam to provide a first object beam, and for generating a copy reference beam, coherent with the first object beam and incident on the holographic copy media; and
    a first optical relay system, disposed between the holographic master media and the holographic copy media, for relaying the first object beam from the holographic master media to the holographic copy media, the holographic copy media recording an interference pattern between the first object beam and the copy reference beam, thereby replicating at least a portion of holographically recorded data,
wherein the path length difference between the first object beam and the copy reference beam at any point in the holographic copy media at which holograms are copied is substantially within the coherence length of the light source.

2. The apparatus of claim 1 wherein the first optical relay system is telecentric in image and/or object space.

3. The apparatus of claim 1 wherein the wavelength of the light generated by the light source is tunable.

4. The apparatus of claim 1 wherein the angle of incidence $\theta_m$ of the master reference beam onto the holographic master media and the angle of incidence $\theta_n$ of the copy reference beam onto the holographic copy media can be varied independently.

5. The apparatus of claim 1 wherein the angle of incidence $\theta_m$ of the master reference beam onto the holographic master media and the angle of incidence $\theta_n$ of the copy reference beam onto the holographic copy media are the same, such that $\theta_m = \theta_n$, or are different, such that $\theta_m \neq \theta_n$.

6. The apparatus of claim 1 wherein the wavelength of the master reference beam onto the holographic master media, $\lambda_m$, and the wavelength of the copy reference beam onto the holographic copy media, $\lambda_n$, are the same, such that $\lambda_m = \lambda_n$ or are different, such that $\lambda_m \neq \lambda_n$.

7. The apparatus of claim 1 wherein the holographic master media is disposed within a resonant cavity, said resonant cavity comprising:
a partial reflector in the optical path of the master reference beam; and
a mirror, disposed in the optical path of a portion of the master reference beam that is not diffracted by the holographic master media, the mirror reflecting the undiffracted portion of the master reference beam at the holographic master media, the holographic master media diffracting the reflected master reference beam and the partial reflector reflecting the undiffracted portion of the reflected master reference beam at the holographic master media to provide an additional first object beam, thereby increasing diffraction efficiency of the holographic master media.

8. The apparatus of claim 7 wherein the mirror in the resonant cavity reflects the undiffracted portion of the master reference beam at the holographic master media, the holographic master media diffracting the reflected master reference beam to provide a second object beam conjugate to the first object beam.

9. The apparatus of claim 8 further including:
a second holographic copy media; and
a second optical relay system for relaying the second object beam conjugate to the first object beam from the holographic master media to the second holographic copy media, wherein the second optical relay system is disposed between the holographic master media and the second holographic copy media so that the optical axes of the first and the second optical relay system optionally coincide.

10. The apparatus of claim 7 wherein the resonant cavity can be rotated independently from the holographic master media, thereby changing the angle of incidence $\theta_m$ of the master reference beam onto the holographic master media, thereby multiplexing the master reference beam.

11. The apparatus of claim 10 wherein the angle of rotation of the resonant cavity is independent of the angle of incidence of the copy reference beam onto the holographic copy media.

12. The apparatus of claim 1 further including a reference beam steering system, disposed in the optical path of the copy reference beam, for changing at least one of the incidence angle, amplitude distribution, phase and wavefront shape of the copy reference beam.

13. The apparatus of claim 12 wherein the reference beam steering system includes an axicon for producing a plurality of conical copy reference beams.

14. The apparatus of claim 13 wherein the reference beam steering system includes a zoom axicon for producing different sets of a plurality of conical copy reference beams.

15. The apparatus of claim 13 wherein the angular separation of the conical angles of the plurality of conical copy reference beams emerging from the axicon equals or exceeds the Bragg angular selectivity of the holographic copy media.

16. The apparatus of claim 15 wherein the axicon is angularly segmented.

17. The apparatus of claim 16 wherein the angularly segmented axicon is operable to be rotated by an angle of $360°/n$ where n is the number of multiplexed holograms.

18. The apparatus of claim 12 wherein the reference beam steering system includes an array of microlenses for producing a plurality of copy reference beams having non-planar wave wavefronts.

19. The apparatus of claim 18 wherein the array of microlenses is translatable in a direction that is tangential to a surface of the holographic copy medium.

20. A method of replicating holographically recorded data, comprising:
generating a master reference beam by a light source;
directing the master reference beam at a holographic master media having holographically recorded data thereon, thereby generating a first object beam;
directing the first object beam at a holographic copy media through a first optical relay system, disposed between the holographic master media and the holographic copy media;
generating a copy reference beam by the light source; and
directing a copy reference beam, coherent with the object beam, at the holographic copy media, thereby recording an interference pattern between the object beam and the copy reference beam thereby replicating at least a portion of holographically recorded data,
wherein the path length difference between the first object beam and the copy reference beam at any point in the holographic copy media at which holograms are copied is substantially within the coherence length of the light source.

21. The method of claim 20 further including
amplifying the diffraction efficiency of the holographic master media; and
optionally, generating a second object beam conjugate to the first object beam, by disposing said holographic master media in a resonant cavity that includes:
a partial reflector in the optical path of the master reference beam; and
a mirror, disposed in the optical path of a portion of the master reference beam that is not diffracted by the holographic master media, the mirror reflecting the undiffracted portion of the master reference beam at the holographic master media, the holographic master media diffracting the reflected master reference beam and the partial reflector reflecting the undiffracted portion of the reflected master reference beam at the holographic master media to provide an additional first object beam and thereby increase diffraction efficiency of the holographic master media and to optionally provide a second object beam conjugate to the first object beam.

22. The method of claim 21 further including multiplexing the first object beam and the second object beam by rotating the resonant cavity independently from the holographic master media, thereby changing the angle of incidence $\theta_m$ of the master reference beam onto the holographic master media thereby producing multiple angle-multiplexed first and second object beams.

23. The method of claim 21 further including multiplexing the first object beam and the second object beam by changing the wavelength, $\lambda_m$, of the master reference beam thereby producing multiple wavelength-multiplexed first and second object beams.

24. The method of claim 21 further including recording a second holographic copy media by
relaying the second object beam conjugate to the first object beam through a second optical relay system from the holographic master media to the second holographic copy media, wherein the second optical relay system is disposed between the holographic master media and the second holographic copy media so that the optical axes of the first and the second optical relay system optionally coincide.

25. The method of claim 20 further including multiplexing the copy reference beam by directing the copy reference beam through a reference beam steering system, thereby changing at least one of the incidence angle, amplitude distribution, phase and wavefront shape of the copy reference beam.

26. The method of claim 25 wherein directing the copy reference beam through a reference beam steering system includes directing said reference beam through an axicon thereby producing a plurality of conical copy reference beams.

27. The method of claim 26 wherein the copy reference beam is directed through a zoom axicon thereby producing different sets of a plurality of conical copy reference beams and multiplexing the copy reference beam.

28. A method of recording at least one layer of holographic data within holographic recording media, comprising:
generating a master reference beam by at least one light source;
directing a master reference beam at a holographic master media having holographically recorded data thereon or at a master mask media having structural data features thereon, thereby generating a first object beam;
relaying the first object beam from the holographic master media or master mask media to a first holographic copy media;
relaying a portion of the first object beam transmitted by the first holographic copy media to a first reflective surface, the first reflective surface reflecting the transmitted portion of the first object beam at the first holographic copy media to generate a first copy reference beam; and
relaying the first copy reference beam to intersect with the first object beam at the holographic copy media, thereby recording an interference pattern between the first copy reference beam and the first object beam and replicating at least a portion of holographically recorded data or mask data,
wherein the path length difference between the first object beam and the copy reference beam at any point in the holographic copy media at which holograms are copied is substantially within the coherence length of the light source.

29. The method of claim 28 further including
amplifying the diffraction efficiency of the holographic master media; and
optionally, generating a second object beam conjugate to the first object beam by disposing said holographic master media in a resonant cavity that includes:
a partial reflector in the optical path of the master reference beam; and
a mirror, disposed in the optical path of a portion of the master reference beam that is not diffracted by the holographic master media, the mirror reflecting the undiffracted portion of the master reference beam at the holographic master media, the holographic master media diffracting the reflected master reference beam and the partial reflector reflecting the undiffracted portion of the reflected master reference beam at the holographic master media to provide an additional first object beam and thereby increase diffraction efficiency of the holographic master media and to optionally provide a second object beam conjugate to the first object beam.

30. The method of claim 29 further including multiplexing the first object beam and the second object beam by rotating the resonant cavity independently from the holographic master media, thereby changing the angle of incidence $\theta_m$ of the master reference beam onto the holographic master media thereby producing multiple angle-multiplexed first and second object beams.

31. The method of claim 29 further including multiplexing the first object beam and the second object beam by changing the wavelength, $\lambda_m$, of the master reference beam thereby producing multiple wavelength-multiplexed first and second object beams.

32. The method of claim 28 further including shifting the first holographic copy media along the direction of an axis between the holographic master media or master mask media and the reflecting surface, thereby recording multiple layers of holographic data within the holographic copy media and replicating at least a portion of holographically recorded data or mask data.

33. The method of claim 32 further including angle, phase and/or wavelength multiplexing the first object beam and the second object beam being used to record at least one of the recorded multiple layers of holographic data within the holographic copy media and thereby multiplexing the replicated portion of holographically recorded data or mask data.

34. The method of claim 28 further including recording a second holographic copy media by
relaying the second object beam conjugate to the first object beam from the holographic master media or master mask media to a second holographic copy media;
relaying a portion of the second object beam conjugate to the first object beam transmitted by the second holographic copy media to a second reflective surface, the second reflective surface reflecting the transmitted portion of the said object beam at a second holographic copy media to generate a second copy reference beam; and
relaying the second copy reference beam to intersect the said second object beam at the second holographic copy media, thereby recording an interference pattern between the copy reference beam and the said second object beam and replicating at least a portion of holographically recorded data or mask data.

35. An apparatus for replicating holographically recorded data or mask data, comprising:
means for generating a master reference beam, comprising a light source;

means for directing the master reference beam at a holographic master media having holographically recorded data thereon or at a master mask media having structural data features thereon, thereby generating a first object beam;

means for directing the first object beam at a holographic copy media;

means for generating a copy reference beam; and means for directing a copy reference beam, coherent with the said object beam, at the holographic copy media so as to intersect the said object beam at the holographic copy media, thereby recording an interference pattern between the object beam and the copy reference beam thereby replicating at least a portion of holographically recorded data or mask data, wherein the path length difference between the first object beam and the copy reference beam at any point in the holographic copy media at which holograms are copied is substantially within the coherence length of the light source.

36. An apparatus for replicating holographically recorded data, comprising:

a holographic master media having holographically recorded data thereon;

a holographic copy media;

a light source for generating a master reference beam, incident on the holographic master media, the holographic master media diffracting the master reference beam to provide a first object beam, and for generating a copy reference beam, coherent with the first object beam and incident on the holographic copy media; and a first optical relay system, disposed between the holographic master media and the holographic copy media, for relaying the first object beam from the holographic master media to the holographic copy media, the holographic copy media recording an interference pattern between the first object beam and the copy reference beam, thereby replicating at least a portion of holographically recorded data, wherein the angle of incidence $\theta_m$ of the master reference beam onto the holographic master media and the angle of incidence $\theta_n$ of the copy reference beam onto the holographic copy media can be varied independently.

37. The apparatus of claim 36, wherein the angle of incidence $\theta_m$ of the master reference beam onto the holographic master media and the angle of incidence $\theta_n$ of the copy reference beam onto the holographic copy media are the same, such that $\theta_m=\theta_n$, or are different, such that $\theta_m\neq\theta_n$.

38. The apparatus of claim 36 wherein the wavelength of the master reference beam onto the holographic master media, $\lambda_m$, and the wavelength of the copy reference beam onto the holographic copy media, $\lambda_n$, are the same, such that $\lambda_m=\lambda_n$ or are different, such that $\lambda_m\neq\lambda_n$.

* * * * *